United States Patent
Okada et al.

(10) Patent No.: US 12,160,652 B2
(45) Date of Patent: Dec. 3, 2024

(54) ELECTRONIC MODULE, ELECTRONIC EQUIPMENT, IMAGING SENSOR MODULE, IMAGING APPARATUS, AND DISPLAY APPARATUS

(71) Applicant: CANON KABUSHIKI KAISHA, Tokyo (JP)

(72) Inventors: Yuya Okada, Yokohama (JP); Koji Noguchi, Yokohama (JP); Mitsutoshi Hasegawa, Yokohama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 18/159,097

(22) Filed: Jan. 25, 2023

(65) Prior Publication Data

US 2023/0188822 A1 Jun. 15, 2023

Related U.S. Application Data

(63) Continuation of application No. 16/741,913, filed on Jan. 14, 2020, now Pat. No. 11,595,557.

(30) Foreign Application Priority Data

Jan. 23, 2019 (JP) .................................. 2019-009363
Dec. 17, 2019 (JP) .................................. 2019-227601

(51) Int. Cl.
*H04N 23/57* (2023.01)
*G06F 1/16* (2006.01)
*H05K 1/03* (2006.01)

(52) U.S. Cl.
CPC ........... *H04N 23/57* (2023.01); *G06F 1/1652* (2013.01); *H05K 1/0393* (2013.01)

(58) Field of Classification Search
CPC ..... H04N 23/57; G06F 1/1652; H05K 1/0393
See application file for complete search history.

(56) References Cited

U.S. PATENT DOCUMENTS

| 6,617,073 B1 | 9/2003 | Matsumoto |
| 10,582,615 B2 | 3/2020 | Noguchi |
(Continued)

FOREIGN PATENT DOCUMENTS

| JP | H7-122834 A | 5/1995 |
| JP | H11-273678 A | 10/1999 |
(Continued)

OTHER PUBLICATIONS

Machine translation of JP-2013-008354-A (Year: 2013).*

(Continued)

*Primary Examiner* — Gevell V Selby
(74) *Attorney, Agent, or Firm* — VENABLE LLP

(57) ABSTRACT

An electronic module has a flexible wiring member, a wiring circuit board, and a conductive connection member. The flexible wiring member has a flexible base, a first wiring layer formed on at least one face of the flexible base, and a first electrode formed of the first wiring layer at the end part that is not covered by a first insulating layer. The wiring circuit board has a base provided with a wiring, a second insulating layer having opening formed on at least one face of the base, and a second electrode formed in the opening. The conductive connection member connects the first electrode and the second electrode to each other. The end of the flexible wiring member is arranged above the opening in plan view.

34 Claims, 11 Drawing Sheets

(56) References Cited

U.S. PATENT DOCUMENTS

| | | | |
|---|---|---|---|
| 10,897,820 B2 | 1/2021 | Noguchi | |
| 11,595,557 B2* | 2/2023 | Okada | H05K 3/363 |
| 2006/0132631 A1 | 6/2006 | Yoshii | |
| 2010/0244020 A1 | 9/2010 | Sakata | |
| 2010/0309323 A1* | 12/2010 | Shin | G02B 27/646 |
| | | | 348/208.4 |
| 2011/0058120 A1* | 3/2011 | Oohira | G02F 1/133608 |
| | | | 361/749 |
| 2012/0248616 A1* | 10/2012 | Kitajima | H05K 3/284 |
| | | | 257/772 |
| 2014/0361183 A1 | 12/2014 | Takeda | |
| 2015/0043175 A1* | 2/2015 | Choi | H05K 1/0283 |
| | | | 174/254 |
| 2015/0062456 A1* | 3/2015 | Miyazaki | G06F 3/04164 |
| | | | 349/12 |
| 2015/0207956 A1 | 7/2015 | Fukushima | |
| 2016/0124259 A1* | 5/2016 | Kawata | G02F 1/13458 |
| | | | 257/773 |
| 2016/0282990 A1* | 9/2016 | Kimura | G06F 3/0412 |
| 2017/0205926 A1* | 7/2017 | Noguchi | G06F 3/0412 |
| 2017/0357122 A1 | 12/2017 | Oh | |
| 2019/0164941 A1* | 5/2019 | Wu | H01L 23/5384 |
| 2020/0064681 A1* | 2/2020 | Son | G02F 1/133512 |
| 2020/0113056 A1 | 4/2020 | Hasegawa | |

FOREIGN PATENT DOCUMENTS

| | | | |
|---|---|---|---|
| JP | 2005-101026 | | 4/2005 |
| JP | 2007-157295 | A | 6/2007 |
| JP | 2012-9478 | A | 1/2012 |
| JP | 2013-8354 | | 1/2013 |
| JP | 2013008354 | A * | 1/2013 |
| JP | 2015-90931 | A | 5/2015 |
| JP | 2016-91001 | A | 5/2016 |
| JP | 2018-112911 | A | 7/2018 |

OTHER PUBLICATIONS

Chinese Office Action issued Sep. 1, 2023 during prosecution of related Chinese Application 202010063596.5 (English-language machine translation included.).

Japanese Search Report issued Nov. 21, 2023 in corresponding Japanese Application No. 2019-227601 (English translation included).

Japanese Office Action issued Apr. 16, 2024 during prosecution of related Japanese application No. 2020-120106 (English-language machine translation included).

* cited by examiner

ELECTRONIC MODULE, ELECTRONIC EQUIPMENT, IMAGING SENSOR MODULE, IMAGING APPARATUS, AND DISPLAY APPARATUS

This application is a continuation of U.S. application Ser. No. 16/741,913, filed Jan. 14, 2020, the contents of which is incorporated by reference herein.

BACKGROUND OF THE INVENTION

Field of the Invention

The present invention relates to an electronic module, an electronic equipment, an imaging sensor module, an imaging apparatus, and a display apparatus.

Description of the Related Art

Japanese Patent Application Laid-Open No. 2005-101026 discloses a technique relating to joining of a flexible circuit board to a circuit board by soldering. In the technique disclosed in Japanese Patent Application Laid-Open No. 2005-101026, when a group of electrode pads on the circuit board and a group of solder terminals on the flexible circuit board are attached to each other and then thermo-compression bonding is performed downward on the flexible circuit board via solder, a stopper structure including a rib part via a dam part is formed at the end portion of the flexible circuit board.

Japanese Patent Application Laid-Open No. 2005-101026 discloses that the rib part comes into contact with the circuit board during thermo-compression bonding, thereby the applied pressure is suppressed, and a gap for a solder pool can be formed between the group of electrode pads on the circuit board and the group of solder terminals on the flexible circuit board.

In the technique disclosed in Japanese Patent Application Laid-Open No. 2005-101026, however, a region having the area corresponding to the dam part and the rib part of the flexible circuit board is required to be secured on the circuit board so that the rib part of the flexible circuit board can come into contact with the circuit board.

SUMMARY OF THE INVENTION

According to one aspect of the present invention, provided is an electronic module including: a flexible wiring member including a flexible base, a first wiring layer formed on at least one face of the flexible base, and a first electrode formed of the first wiring layer at an end part that is not covered by a first insulating layer; a wiring circuit board including a base provided with a wiring, a second insulating layer having an opening formed on at least one face of the base, and a second electrode formed in the opening; and a conductive connection member that connects the first electrode and the second electrode to each other, wherein an end of the flexible wiring member is arranged above the opening in plan view.

Further features of the present invention will become apparent from the following description of exemplary embodiments with reference to the attached drawings.

DESCRIPTION OF THE EMBODIMENTS

Figure 1A:
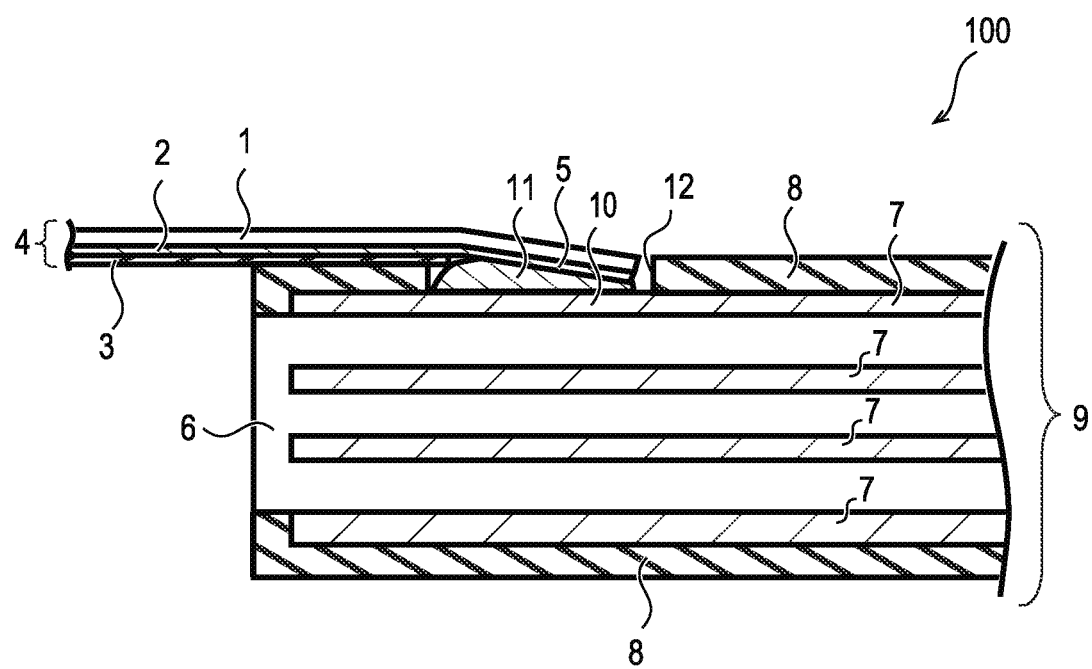
FIG. 1A is a sectional view illustrating the structure of a connection portion between a flexible wiring member and a printed wiring board, which is a wiring base, in an electronic module according to a first embodiment of the present invention.

Embodiments for implementing the present invention will be described in detail below with reference to the drawings. Note that the present invention is not limited to the embodiments described below and can be changed as appropriate within the scope not departing from the spirit of the present invention. Further, in the drawings described below, components having the same function are labeled with the same reference symbols, and the description thereof may be omitted or simplified.

Electronic Module

First Embodiment

The structure of the electronic module according to the first embodiment of the present invention will be described with reference to FIG. 1A and FIG. 1B.

FIG. 1A is a sectional view illustrating the structure of a connection portion between a flexible wiring member and a printed wiring board, which is a wiring base, in an electronic module according to the present embodiment.

As illustrated in FIG. 1A, an electronic module 100 according to the present embodiment has a flexible wiring member 4 and a printed wiring board 9 that is a wiring base on which the flexible wiring member 4 is directly connected and mounted by soldering. The flexible wiring member 4 is a film-like flexible printed wiring board with bendability. Unlike the flexible wiring member 4, the printed wiring board 9 is a rigid printed wiring board that is a rigid plate.

The flexible wiring member 4 has a flexible base 1, a flexible wiring layer 2 that is a first wiring layer, and a coverlay 3 that is a first insulating layer. As described below, the flexible wiring member 4 has one or more conductive layers as a flexible wiring layer 2, and is configured such that the conductive layers are stacked as an insulating layer via the flexible base 1. Note that, in the present embodiment, while a case where the wiring layer in the flexible wiring member 4 is a single layer is described, the wiring layer is not limited to a single layer and may have two or more layers.

The flexible base 1 is a sheet-like or film-like insulating base formed of a resin or the like, for example, and has flexibility and bendability. Thus, the flexible wiring member 4 is configured to be deformable, such as to be bent. The insulator forming the flexible base 1 may have electrical insulation. As an insulator forming the flexible base 1, polyimide, polyethylene terephthalate, or the like is used, for example.

The flexible wiring layer 2 is a conductive layer formed of a copper foil, another metal foil, or the like. The flexible wiring layer 2 has a wiring pattern. The flexible wiring layer 2 is formed on one side or both sides of the flexible base 1. A conductor forming the flexible wiring layer 2 is a substance having higher conductivity and higher thermal conductivity than the insulator, for example, a metal such as copper, silver, gold, or the like. Note that the flexible wiring layer 2 may be formed on at least one face of the flexible base 1.

The coverlay 3 is an insulating layer that protects a circuit formed of the flexible wiring layer 2. The coverlay 3 is formed of a coverlay film, an overcoat, or the like. The coverlay 3 is formed so as to cover the flexible wiring layer 2 on the face on which the flexible wiring layer 2 of the flexible base 1 is formed.

At the end part of the flexible wiring member 4, the coverlay 3 is not formed, and the flexible wiring layer 2 is exposed. The exposed part of the flexible wiring layer 2 forms a first electrode 5. A plurality of first electrodes 5 are arranged at a predetermined pitch. In such a way, the first electrode 5 is formed of the flexible wiring layer 2 exposed at the end part of the flexible wiring member 4.

The printed wiring board 9 that is a wiring base has a printed wiring base 6 that is a base, a wiring layer 7 that is a second wiring layer, and a second insulating layer 8.

Note that, in the present embodiment, while the case where the number of wiring layers in the printed wiring board 9 is four is described, the number of wiring layers is not limited to four. The wiring layer in the printed wiring board 9 may be a single layer or multiple layers, that is, may have four or less layers or four or more layers.

The printed wiring base 6 that is a base is an insulating base made of a rigid composite material or the like and shaped in a board, for example. Unlike the flexible base 1, the printed wiring base 6 is a rigid material. An insulator forming the printed wiring base 6 may have electrical insulation. For example, as the printed wiring base 6, an organic wiring circuit board using a glass epoxy base, a ceramic wiring circuit board using ceramic, or a metal core wiring circuit board having a metal core layer may be used. Further, a base is not limited to a printed wiring base and may be a silicon substrate.

The wiring layer 7 is a conductive layer formed of a copper foil, another metal foil, or the like. The wiring layer 7 has a wiring pattern. The wiring layer 7 is formed on one face or both faces of the printed wiring base 6. Further, one or multiple layers of the wiring layers 7 are formed inside the printed wiring base 6. FIG. 1A represents the case where four layers of the wiring layers 7 in total are formed on the both faces and the inside of the printed wiring base 6. A conductor forming the wiring layer 7 is a substance having higher conductivity and higher thermal conductivity than the insulator, for example, a metal such as copper, silver, gold, or the like. Note that the wiring layer 7 may be formed on at least one face of the printed wiring base 6.

The second insulating layer 8 is an insulating protection film that protects a circuit formed of the wiring layer 7. In the first embodiment, the second insulating layer 8 is formed of a cured liquid solder resist, a film-like solder resist, or the like. Note that, as the second insulating layer 8, a nitride or an oxide such as SiN or $Al_2O_3$ having high insulation may also be used. The second insulating layer 8 is formed so as to cover the wiring layer 7 on the surface on which the wiring layer 7 of the printed wiring base 6 is formed.

An opening 12 is formed in the second insulating layer 8. The wiring layer 7 is exposed in the opening 12. The exposed part of the wiring layer 7 forms a second electrode 10. A plurality of second electrodes 10 are arranged at a predetermined pitch. In such a way, the second electrode 10 is formed of the wiring layer 7 exposed in the opening 12. Note that, as long as electrical connection is possible, a protection film formed of a metallic oxide or a metallic nitride may be provided in a part of the second electrode 10.

The flexible wiring member 4 is mounted on the face on which the second electrode 10 of the printed wiring board 9 is exposed in a state where a face on which the first electrode 5 is formed faces the printed wiring board 9. A part in which the first electrode 5 of the flexible wiring member 4 is exposed is referred to as the end part. The first electrode 5 and the second electrode 10 are arranged to face each other so as to at least partially overlap in plan view from a direction perpendicular to the printed wiring board 9.

The end of the flexible wiring member 4 is arranged so as to be bent obliquely and fall in the opening 12 formed in the second insulating layer 8. The end of the flexible wiring member 4 falls in the opening 12 with the first electrode 5 facing the second electrode 10 in the opening 12. That is, the end part of the flexible wiring member 4 is fit in the opening 12 with the first electrode 5 facing the second electrode 10 in the opening 12. Thereby, the end of the flexible wiring member 4 is arranged in the opening 12. In other words, the end of the flexible wiring member 4 is arranged on the opening 12 in plan view.

Note that not whole the end of the flexible wiring member 4 is required to be arranged in the opening 12. The end of the flexible wiring member 4 may be partially arranged in the opening 12 such that, for example, the part on the printed wiring board 9 side of the end falls and is fit in the opening 12.

The first electrode 5 exposed at the end part of the flexible wiring member 4 that falls in the opening and the second electrode 10 exposed in the opening 12 are connected via solder 11 that is a conductive connection member. Since the end part of the flexible wiring member 4 is bent obliquely inside the opening 12, the first electrode 5 connected to the second electrode 10 is inclined at a predetermined angle relative to the second electrode 10.

The solder 11 that is a conductive connection member is solder that is solidified after heating of a solder-contained connecting material, and is a member that connects the first electrode 5 of the flexible wiring member 4 to the second electrode 10 of the printed wiring board 9. A solder-contained connecting material may be supplied by combining Sn-3.0% Ag-0.5% Cu solder or Sn-58% Bi solder with flux or may be supplied by containing solder particle powder in a thermosetting resin or a thermoplastic resin, for example. Further, as a solder-contained connecting material, a solder pre-coat may be formed in advance on the first electrode 5 or the second electrode 10, and the flux may be supplied thereto. Note that the solder-contained connecting material is not particularly limited and may be any conductive material that can fix and electrically connect the first electrode 5 and the second electrode 10 to each other. Further, the conductive connection member is not limited to solder, and a metal or a resin such as an anisotropic conductive film or an anisotropic conductive resin can be used.

Accordingly, the end part of the flexible wiring member 4 connected to the printed wiring board 9 by the solder 11 is bent and falls in the opening 12 formed in the second insulating layer 8 of the printed wiring board 9. On the other hand, the part opposite to the end of the flexible wiring member 4 is laid on the second insulating layer 8 of the printed wiring board 9. Thereby, the flexible wiring member 4 has a part that is in contact with the second insulating layer 8. The end of the first electrode 5 side of the coverlay 3 is located inside the opening 12.

Figure 1B:
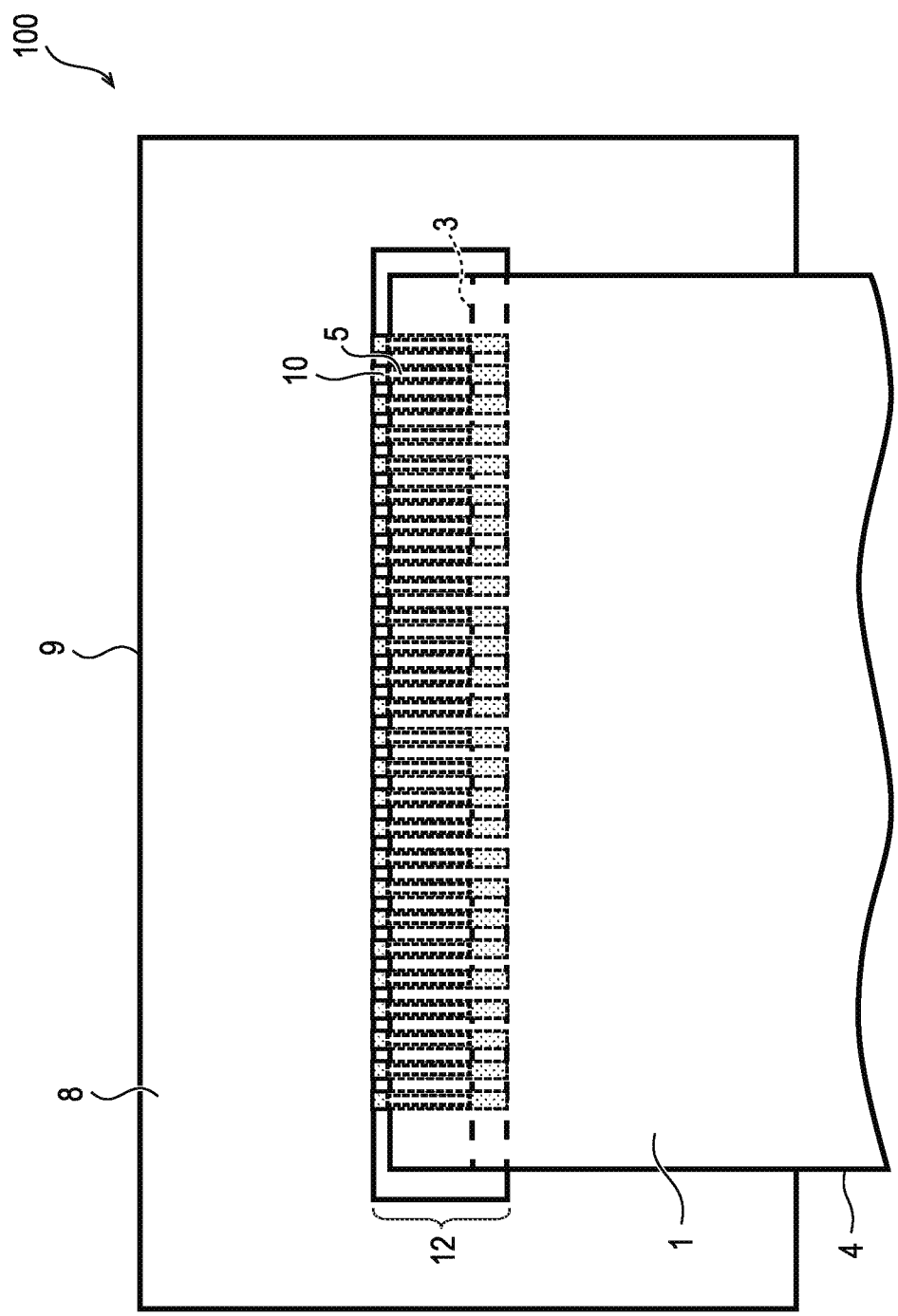
FIG. 1B is a top view illustrating the structure of the connection portion between the flexible wiring member and the printed wiring board, which is a wiring base, in the electronic module according to the first embodiment of the present invention.

FIG. 1B is a top view illustrating the structure of the connection portion between the flexible wiring member 4 and the printed wiring board 9 in the electronic module 100 according to the present embodiment. FIG. 1B illustrates the structure of the electronic module 100 in plan view from a direction perpendicular to the printed wiring board 9 viewed from the flexible wiring member 4 side.

As illustrated in FIG. 1B, the coverlay 3 is not formed at the end part of the flexible wiring member 4, and a plurality of first electrodes 5 are formed of the exposed flexible wiring layer 2. The plurality of first electrodes 5 are arranged at a predetermined pitch in the width direction along an edge side of the flexible wiring member 4, for example.

Further, in the second insulating layer 8 of the printed wiring board 9, the opening 12 in which the wiring layer 7 is exposed is formed. A plurality of second electrodes 10 are formed of the exposed wiring layer 7 at the opening 12. For example, the plurality of second electrodes 10 are arranged on the side of one long side of the rectangular opening 12 so as to be arranged at a predetermined pitch in a direction along the long side.

The first electrode 5 and the second electrode 10 are arranged to face each other for each of a plurality of pairs corresponding to each other so as to at least partially overlap in plan view from the direction perpendicular to the printed wiring board 9.

Further, the width of the opening 12 is larger than the width of the end part of the flexible wiring member 4 in a direction that is perpendicular to the direction of falling in the opening 12 at the end part of the flexible wiring member 4 and parallel to the printed wiring board 9. That is, the width of the opening 12 in the direction in which the plurality of second electrodes 10 are arranged is larger than the width of the end of the flexible wiring member 4 in the direction in which the plurality of first electrodes 5 are arranged. In such a way, the width of the end part of the flexible wiring member 4 is narrower than the width of the opening 12 in the width direction of the end part. Therefore, the end part of the flexible wiring member 4 is arranged so as to more easily fall in the opening 12. Thus, the first electrode 5 and the second electrode 10 are more reliably connected via the solder 11.

In such a way, according to the present embodiment, the first electrode 5 and the second electrode 10 can be more reliably connected to via the solder 11, even when these electrodes are arranged at a narrow pitch such that the electrode interval is 0.1 mm or less and the amount of the solder-contained connecting material supplied onto the electrode is small.

As described above, the electronic module 100 having the flexible wiring member 4 and the printed wiring board 9 is configured. Note that electronic components may be mounted in any one or both of the printed wiring board 9 and the flexible wiring member 4. The electronic component is not particularly limited, and various electronic components may be mounted. In a sixth embodiment described below, a case where an imaging sensor element 15 as an electronic component is mounted on a printed wiring board 9 will be described.

A digital still camera or a digital video camera is required to transfer a large amount of data between an imaging sensor and large scale integration (LSI) used for image processing due to the increased the number of pixels of a static image and a moving image or an increased framerate. The imaging sensor is a complementary metal oxide semiconductor (CMOS) image sensor, a charge coupled device (CCD) image sensor, or the like. Further, to reduce the size of a product or to improve the image stabilizing performance inside a camera in which image stabilizing is performed by moving the imaging sensor, further reduction of the size of the imaging sensor module is required.

In general, a printed wiring board of an imaging sensor module mounted with an imaging sensor and a printed wiring board mounted with LSI used for image processing are connected by a flexible wiring circuit board via a connecter. The connecter mechanically fixes the flexible wiring circuit board by a metal spring or the like and causes the electrode of the flexible wiring circuit board and the electrode in the connecter to be electrically contacted and conducted.

A greater amount of data transferred to the LSI used for image processing from the imaging sensor requires a larger number of wirings of the flexible wiring circuit board. On the other hand, since the connecter mechanically fixes the flexible wiring circuit board, a smaller connecter has a smaller force for mechanically fixing the flexible wiring circuit board, which makes it difficult to have conduction between the connecter and the electrode of the flexible wiring circuit board. Thus, there is a limitation in reduction in size of the connecter. If such a connector were used for connection, as the amount of data transfer would increase and the number of wirings on the flexible wiring circuit board would increase, the size of the connector would be larger, and the size of the imaging sensor module would be larger.

Accordingly, Japanese Patent Application Laid-Open No. 2005-101026 proposes the technique for direct connection between the electrodes by thermo-compression bonding using solder via no connecter. However, since the technique disclosed in Japanese Patent Application Laid-Open No. 2005-101026 is required to secure the area corresponding to a rib part and a dam part used for suppressing the applied pressure and forming a solder pool, it is difficult to connect the electrodes to each other in a narrow area.

When the connection is made by using the solder 11 via no connecter, it is required that the first electrode 5 and the second electrode 10 contact with the solder-contained connecting material, respectively, in a state where the solder-contained connecting material is heated at a higher temperature than the melting point of the solder.

However, when the distance between the first electrodes 5 and the distance between the second electrodes 10 are narrow, and the first electrode 5 and the second electrode 10 are arranged at a narrow pitch, respectively, the supplied amount of the solder-contained connecting material supplied on the electrode decreases. As a result, the first electrode 5 and the second electrode 10 are less likely to be connected to the solder 11, which is likely to cause a contact failure.

In contrast, in the present embodiment, the end part where the first electrode 5 of the flexible wiring member 4 is exposed falls in the opening 12 formed in the second insulating layer 8. Thereby, the end part where the first electrode 5 of the flexible wiring member 4 is exposed is arranged in the opening 12. Such an arrangement of the end part of the flexible wiring member 4 including the first electrode 5 enables both of the first electrode 5 and the second electrode 10 to be reliably contacted by the solder 11. As a result, according to the present invention, the first electrode 5 of the flexible wiring member 4 can be reliably connected to the second electrode 10 of the printed wiring board 9 via the solder 11. Moreover, according to the present embodiment, since it is not required to secure the area corresponding to the structure such as a rib part or a dam part, the first electrode 5 and the second electrode 10 can be connected to each other at a narrow electrode pitch.

On the other hand, when the solder-contained connecting material contacts to the adjacent electrode extruded out of between the first electrode 5 and the second electrode 10 when the first electrode 5 and the second electrode 10 are connected to each other, the solder 11 and the electrode may be short-circuited and cause a contact failure. In particular, when the first electrode 5 and the second electrode 10 are arranged at a narrow pitch, respectively, since the distance between the electrodes is narrow, a short circuit failure between the electrodes may occur.

In contrast, in the present embodiment, the part opposite to the end of the flexible wiring member 4 is laid on the second insulating layer 8 of the printed wiring board 9. That is, the flexible wiring member 4 has a part contacting with the second insulating layer 8. Thus, on the side opposite to the end of the flexible wiring member 4, at least a space from the surface of the second electrode 10 of the printed wiring board 9 to the surface of the second insulating layer 8 is secured. In this space, since the solder 11 can be held when the first electrode 5 and the second electrode 10 are connected to each other, it is possible to prevent the solder 11 from extruding from a part between the first electrode 5 and the second electrode 10 and causing a short circuit failure in the present embodiment.

Further, when the solder-contained connecting material extrudes over the opening 12 of the second insulating layer 8, the solder 11 interposed between by the flexible wiring member 4 on the second insulating layer 8 moves, and a short circuit may occur between electrodes. Thus, it is desirable that the volume V of the solder-contained connecting material supplied between the first electrode 5 and the second electrode 10 be less than or equal to a predetermined amount in terms of prevention of a short circuit between the electrodes. That is, it is desirable that the volume V of the solder-contained connecting material satisfy the following Equation (1) where the area of the first electrode 5 is denoted as S1, the area of the second electrode 10 is denoted as S2, and the height from the surface of the second electrode 10 to the surface of the second insulating layer 8 is denoted as H1.

$$V < (S1+S2)/2 \times H1 \qquad \text{Equation (1)}$$

When the volume V of the solder-contained connecting material satisfies the above Equation (1), the solder does not extrude over the opening 12 formed in the second insulating layer 8.

Further, it is desirable that the distance D1 between the first electrodes 5 and the distance D2 between the second electrodes 10 be greater than or equal to a predetermined distance in terms of prevention of a short circuit between electrodes, respectively. That is, it is desirable that the distance D1 between the first electrodes 5 and the distance D2 between the second electrodes 10 satisfy the following Equations (2a) and (2b), respectively, where the height from the surface of the printed wiring base 6 to the surface of the second insulating layer 8 is denoted as H2, and the cross-sectional length in the transverse direction of the opening 12 of the second insulating layer 8 is denoted as L. The cross-sectional length L in the transverse direction of the opening 12 is a length of the opening 12 in the direction along the surface of the printed wiring board 9 perpendicular to the direction in which the plurality of second electrodes 10 are arranged. Note that, in Equations (2a) and (2b), V is a volume of the solder-contained connecting material supplied between the first electrode 5 and the second electrode 10 as described above.

$$D1 \geq V/(H2 \times L) \qquad \text{Equation (2a)}$$

$$D2 \geq V/(H2 \times L) \qquad \text{Equation (2b)}$$

In such a way, with the distances D1 and D2 between electrodes being secured, the volume of the space between electrodes is larger than the volume V of the solder-contained connecting material arranged between the first electrode 5 and the second electrode 10. Thus, a short circuit is less likely to occur between neighboring first electrodes 5 and between neighboring second electrodes 10.

In a general printed wiring board 9, the thickness of a copper foil used as the second electrode 10 is around 5 to 20 μm, and the thickness of the second insulating layer 8 is 20 to 40 μm. In such a case, when each width of the first electrode 5 and the second electrode 10 is 75 μm, it is desirable that the distance D1 between the first electrodes 5 and the distance D2 between the second electrodes 10 be greater than or equal to 66 μm, respectively. In the same case, when each width of the first electrode 5 and the second electrode 10 is 100 μm, it is desirable that the distance D1 between the first electrodes 5 and the distance D2 between the second electrodes 10 be greater than or equal to 88 μm, respectively, and when each width of the first electrode 5 and the second electrode 10 is 200 μm, it is desirable that the distances D1 and D2 be greater than or equal to 175 μm, respectively.

Note that the area S1 of the first electrode 5 and the area S2 of the second electrode 10 may be the same or may not be the same.

Further, when the end of the flexible wiring member 4 is contacted with the inner wall of the opening 12 formed in the second insulating layer 8, the end part of the flexible wiring member 4 is less likely to fall in the opening 12. Accordingly, it is desirable that the end of the flexible wiring member 4 and the inner wall of the opening 12 be arranged so as to be spaced apart from each other by a certain distance. Specifically, taking the thermal expansion coefficient of the flexible wiring member 4 and the connection temperature of the solder 11 into consideration, it is desirable that the end of the flexible wiring member 4 and the inner wall of the opening 12 be spaced apart by a distance that is greater than or equal to the extension amount of the flexible wiring member 4 when the first electrode 5 and the second electrode 10 are connected to each other. It is desirable that such an arrangement relationship between the end of the flexible wiring member 4 and the inner wall of the opening 12 be satisfied not only in the structure obtained in heating for soldering by the solder 11 but also in the structure obtained after the soldering. Note that, for example, the linear expansion coefficient of the flexible wiring member 4 using polyimide as the flexible base 1 is less than or equal to 12 to 30 ppm/degrees Celsius.

In such a way, according to the present embodiment, the flexible wiring member 4 and the printed wiring board 9 can be directly connected to each other at a narrow electrode pitch via no connecter.

First Example

An electronic module and a manufacturing method thereof according to the first example will be described. The flexible wiring member 4 was configured to have polyimide of a thickness of 25 µm as the flexible base 1, a copper foil of a thickness of 6 µm as the flexible wiring layer 2, and polyimide of a thickness of 15 µm as the coverlay 3. The first electrode 5 was formed by exposing the copper foil of the flexible wiring layer 2 in the cross-section direction by a width of 0.8 mm and in a direction perpendicular to the cross section by a width of 18 mm in FIG. 1A without providing the coverlay 3 at the end part of the flexible wiring member 4. The first electrodes 5 had a width of 100 µm and were arranged at a pitch of 200 µm with a distance of 100 µm between the neighboring first electrodes 5.

The printed wiring board 9 was a four-layer substrate having a total thickness of 500 µm, which was constructed by using FR-4 material as the printed wiring base 6 and a copper foil as the wiring layer 7. In the printed wiring board 9, the second insulating layer 8 having a thickness of 20 µm was opened to form the opening 12 having an opening width of 20 mm, an opening length of 1 mm, and an opening depth of 20 µm. Further, the copper foil having a thickness of 12 µm of a surface layer is exposed in the cross-section direction of FIG. 1A by a width of 1 mm to form the second electrode 10. As a solder-contained connecting material in advance, a Sn-3.0% Ag-0.5% Cu solder pre-coat was formed on the second electrode 10, and flux was supplied on the second electrode 10.

The first electrode 5 and the second electrode 10 were arranged so as to face each other so that at least a part thereof overlapped in plan view from a direction perpendicular to the printed wiring board 9. Further, the end part of the flexible wiring member 4 was arranged so as to fall in the opening 12 formed in the second insulating layer 8. In addition, the part opposite to the end of the flexible wiring member 4 was laid on the second insulating layer 8 of the printed wiring board 9. At this time, the end of the flexible wiring member 4 on the first electrode 5 side of the coverlay 3 was arranged so as to be located inside the opening 12 formed in the second insulating layer 8 of the printed wiring board 9.

The part on the end side of the flexible wiring member 4 were then fixed to the printed wiring board 9 by a polyimide tape. In this state, reflow heating was performed such that the peak temperature of the solder-contained connecting material was larger than or equal to 220 degrees Celsius and less than 250 degrees Celsius, and the first electrode 5 and the second electrode 10 were connected to each other by soldering. The polyimide tape was then removed.

Note that the linear expansion coefficient of the flexible wiring member 4 was around 15 ppm/degrees Celsius. Thus, taking an extension amount of about 30 µm at the end part of 0.8 mm of the flexible wiring member 4 at 250 degrees Celsius into consideration, the end of the flexible wiring member 4 was connected in a state where the end was arranged about 50 µm away from the inner wall of the opening 12 of the second insulating layer 8. At this time, the end of the flexible wiring member 4 was connected to the surface of the second electrode 10 of the printed wiring base 6 with an inclination of about 2 degrees.

Connection using such a structure enabled the flexible wiring member 4 and the printed wiring board 9 to be connected to each other at a narrow electrode pitch of 200 µm.

Second Embodiment

Figure 2:
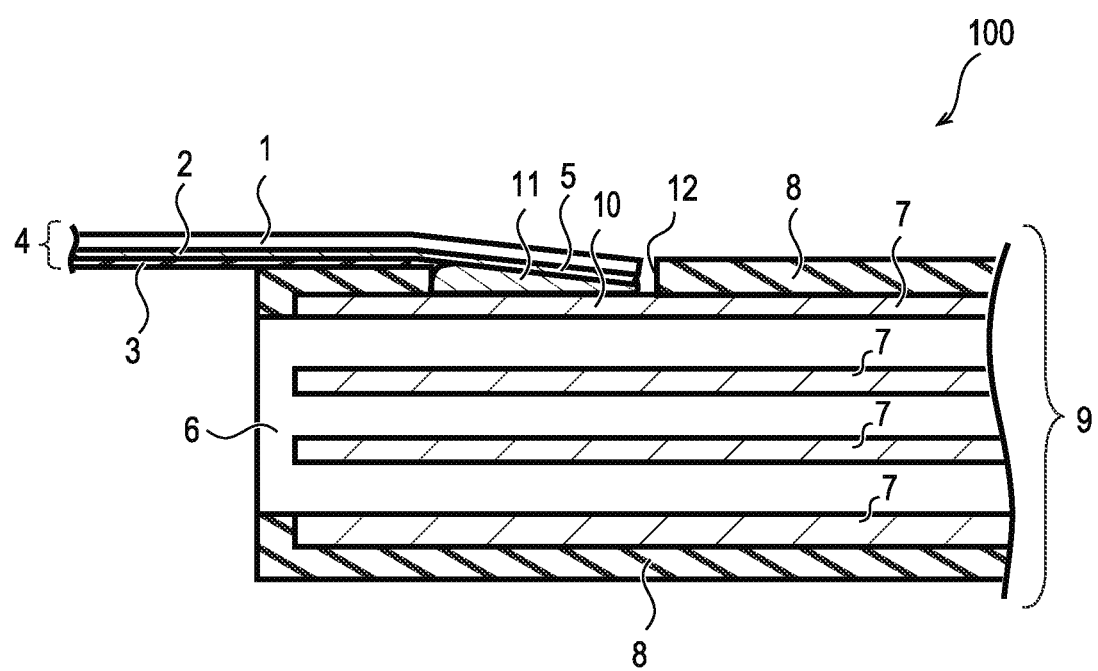
FIG. 2 is a sectional view illustrating the structure of a connection portion between a flexible wiring member and a printed wiring board, which is a wiring base, in an electronic module according to a second embodiment of the present invention.

The structure of an electronic module according to the second embodiment of the present invention will be described with reference to FIG. 2. FIG. 2 is a sectional view illustrating a structure of a connection portion between a flexible wiring circuit board and a printed wiring board in an electronic module according to the present embodiment.

The basic structure of the electronic module according to the present embodiment is substantially the same as the structure of the electronic module according to the first embodiment. The electronic module according to the present embodiment is different from the first embodiment in the position of the end of the coverlay 3 on the first electrode 5 side with respect to the opening 12 formed in the second insulating layer 8.

As illustrated in FIG. 2, the electronic module 100 according to the present embodiment has the flexible wiring member 4 and the printed wiring board 9 mounted by directly connecting to the flexible wiring member 4 by soldering as with the first embodiment.

The end part of the flexible wiring member 4 is arranged so as to be bent and fall in the opening 12 formed in the second insulating layer 8 as with the first embodiment. The first electrode 5 exposed at the end part and the second electrode 10 exposed in the opening 12 are connected via the solder 11 as with the first embodiment.

Accordingly, the end part of the flexible wiring member 4 connected to the printed wiring board 9 by the solder 11 is bent and falls in the opening 12 formed to the second insulating layer 8 as with the first embodiment. The part opposite to the end of the flexible wiring member 4 is also laid on the second insulating layer 8 of the printed wiring board 9 as with the first embodiment.

On the other hand, in the present embodiment, unlike the first embodiment, the edge of the coverlay 3 on the first electrode 5 side is located outside the opening 12 formed in the second insulating layer 8. Thereby, the edge of the coverlay 3 on the first electrode 5 side is located on the second insulating layer 8. In such a way, since the coverlay 3 is arranged such that the edge of the first electrode 5 side of the coverlay 3 is located on the second insulating layer 8, the area of the end part of the flexible wiring member 4 that falls in the opening 12 can be larger than the area of the end part of the flexible wiring member 4 that falls in the opening 12 in the present embodiment compared to the first embodiment.

In such a way, according to the present embodiment, by increasing the area of the end part of the flexible wiring member 4 that falls in the opening 12, it is possible to increase the connection area between the first electrode 5 and the second electrode 10. That is, according to the present embodiment, the first electrode 5 and the second electrode 10 can be more reliably contacted and connected via the solder 11 even when these electrodes are arranged at a narrow pitch such that the electrode interval is 0.1 mm, for example, or less and the amount of the solder-contained connecting material supplied onto the electrode is small.

Second Example

An electronic module and a manufacturing method thereof according to the second example will be described. The flexible wiring member 4 was configured to have polyimide of a thickness of 25 μm as the flexible base 1, a copper foil of a thickness of 6 μm as the flexible wiring layer 2, and polyimide of a thickness of 15 μm as the coverlay 3. The first electrode 5 was formed by exposing the copper foil of the flexible wiring layer 2 in the cross-section direction by a width of 1.4 mm and in a direction perpendicular to the cross section by 24.6 mm in FIG. 2 without providing the coverlay 3 in the end part of the flexible wiring member 4. The first electrodes 5 had a width of 75 μm and were aligned at a pitch of 150 μm with a distance of 75 μm between the neighboring first electrodes 5.

The printed wiring board 9 was a four-layer substrate having a total thickness of 500 μm, which was constructed by using FR-4 material as the printed wiring base 6 and a copper foil as the wiring layer 7. In the printed wiring board 9, the second insulating layer 8 having a thickness of 20 μm was opened to form the opening 12 having an opening width of 25.6 mm, an opening length of 1 mm, and an opening depth of 20 μm. Further, the opening 12 is formed, and the copper foil having a thickness of 12 μm of a surface layer was exposed in the cross-section direction of FIG. 2 by a width of 1 mm to form the second electrode 10. As a solder-contained connecting material in advance, a Sn-3.0% Ag-0.5% Cu solder pre-coat was formed on the second electrode 10, and flux was supplied on the second electrode 10.

The first electrode 5 and the second electrode 10 were arranged so as to face each other so that at least a part thereof overlapped in plan view from a direction perpendicular to the printed wiring board 9. Further, the end part of the flexible wiring member 4 is arranged so as to fall in the opening 12 formed in the second insulating layer 8. Further, the part opposite to the end of the flexible wiring member 4 was laid on the second insulating layer 8 of the printed wiring board 9. At this time, the end of the flexible wiring member 4 on the first electrode 5 side of the coverlay 3 was arranged so as to be located outside the opening 12 formed in the second insulating layer 8 of the printed wiring board 9.

The part on the end side of the flexible wiring member 4 was then pressed and fixed by force at 0.03 to 0.1 MPa to the print wiring board 9 with a tool T using a magnetic body. In this state, induction heating was performed such that the peak temperature of the solder-contained connecting material was larger than or equal to 220 degrees Celsius and less than 250 degrees Celsius, and the first electrode 5 and the second electrode 10 were connected to each other by soldering.

Note that the linear expansion coefficient of the flexible wiring member 4 was around 15 ppm/degrees Celsius. Thus, taking an extension amount of about 30 μm at the end part of 0.8 mm of the flexible wiring member 4 at 250 degrees Celsius into consideration, the end of the flexible wiring member 4 was connected in a state where the end was arranged about 50 μm away from the inner wall of the opening 12 formed in the second insulating layer 8. At this time, the end of the flexible wiring member 4 was connected to the surface of the second electrode 10 of the printed wiring base 6 with an inclination of about 2 degrees.

Connection using such a structure enabled the flexible wiring member 4 and the printed wiring board 9 to be connected to each other at a narrow electrode pitch of 150 μm.

Manufacturing Method of Electronic Module

Figure 3A:
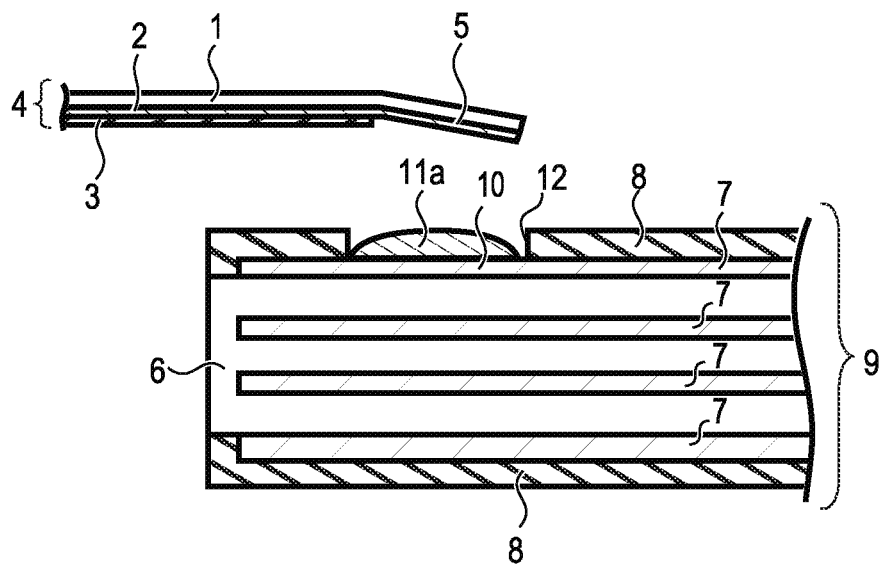
FIG. 3A, FIG. 3B, and FIG. 3C are sectional views illustrating a manufacturing method of the electronic module according to the first embodiment of the present invention.
Figure 3B:
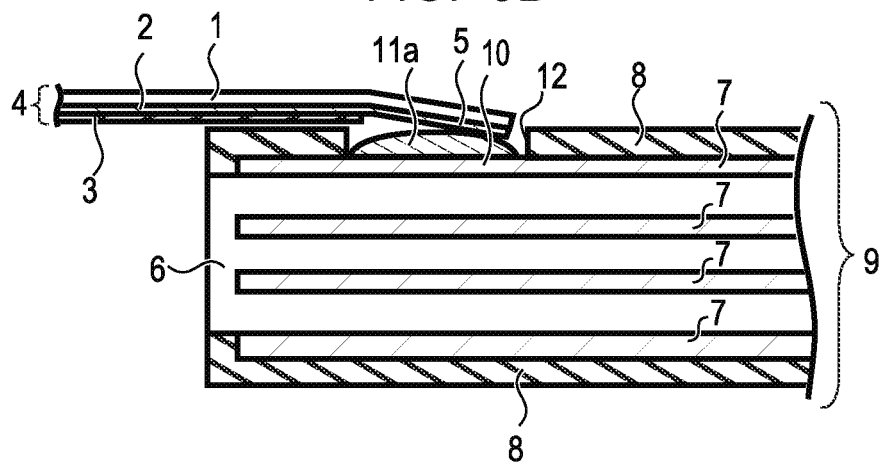
Figure 3C:
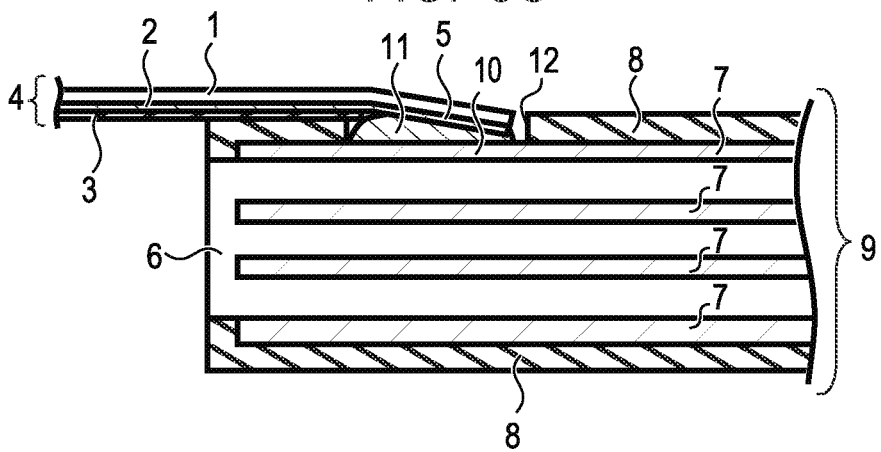

Next, a manufacturing method for manufacturing the electronic module 100 according to the first embodiment will be described with reference to FIG. 3A to FIG. 3C. FIG. 3A, FIG. 3B, and FIG. 3C are sectional views illustrating a manufacturing method of the electronic module 100 according to the first embodiment. Note that an electronic module 100 according to the second embodiment can also be manufactured by substantially the same method. Note that the manufacturing method for manufacturing the electronic module 100 includes a connection method for connecting the flexible wiring member 4 and the printed wiring board 9 to each other.

First, as illustrated in FIG. 3A, in the printed wiring board 9, a solder-contained connecting material 11a is supplied on the second electrode 10 exposed in the opening 12 formed in the second insulating layer 8. It is desirable that the volume V of the solder-contained connecting material satisfy Equation (1) as described in the first embodiment.

Next, as illustrated in FIG. 3B, the first electrode 5 of the flexible wiring member 4 and the second electrode 10 on the printed wiring board 9 are aligned so as to face each other, and the end part of the flexible wiring member 4 is arranged so as to fall in the opening 12 formed in the second insulating layer 8. At this time, for example, it is desirable that the solder-contained connecting material 11a have viscosity like a solder paste, and the end part of the flexible wiring member 4 be temporarily fixed to the printed wiring board 9. Further, for example, the end part of the flexible wiring member 4 may be fixed to the printed wiring board 9 by using a heat-resisting tape such as a polyimide tape or a heat-resisting adhesive agent. Thus, the first electrode 5 and the second electrode 10 are contacted with the solder-contained connecting material 11a.

Further, it is desirable that the end of the flexible wiring member 4 and the inner wall of the opening 12 be arranged so as to be spaced apart from each other by a certain distance as described in the first embodiment.

Next, the end part of the flexible wiring member 4 is caused to fall in the opening 12 formed in the second insulating layer 8, and the first electrode 5 and the second electrode 10 are then heated in contact with the solder-contained connecting material 11a. Accordingly, solder of the solder-contained connecting material 11a is melted. After completion of the heating, a junction part obtained by soldering is cooled by naturel cooling, cooling with a cooler, or the like. Accordingly, as illustrated in FIG. 3C, the first electrode 5 and the second electrode 10 are connected via the solder 11. By doing so, it is possible to reliably connect the first electrode 5 and the second electrode 10 to each other and connect the first electrode 5 and the second electrode 10 to each other while preventing the solder 11 from extruding from a part between the first electrode 5 and the second electrode 10 and causing a short circuit failure.

A method for melting solder is not particularly limited, and whole heating such as reflow heating may be a method for melting solder, for example. Further, for example, a method for melting solder may be contact local heating using a soldering copper or the like or non-contact local heating such as a spot reflow or a laser using a hot blast or a lamp, or induction heating or dielectric heating. With the use of non-contact local heating, even when an electronic component having a low heat resistance is mounted on one or both of the printed wiring board 9 and the flexible wiring member 4, the printed wiring board 9 can be connected to the flexible wiring member 4 without affecting the electronic component.

Note that, while the case where the solder-contained connecting material 11a is supplied on the second electrode 10 has been described above, instead of or in addition to the above, the solder-contained connecting material 11a can also be supplied on the first electrode 5. Further, a manner to supply the solder-contained connection member 11a is not particularly limited and, for example, the solder-contained connecting material 11a can be supplied in a form of paste, or the solder-contained connecting material 11a can be supplied in a form of pre-coat.

Figure 4A:
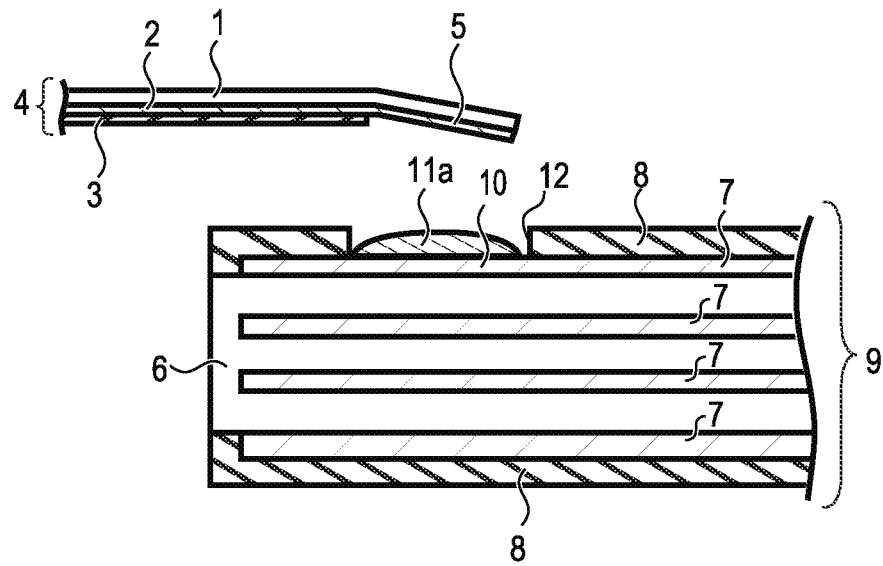
FIG. 4A, FIG. 4B, and FIG. 4C are sectional views illustrating another manufacturing method of the electronic module according to the first embodiment of the present invention.
Figure 4B:
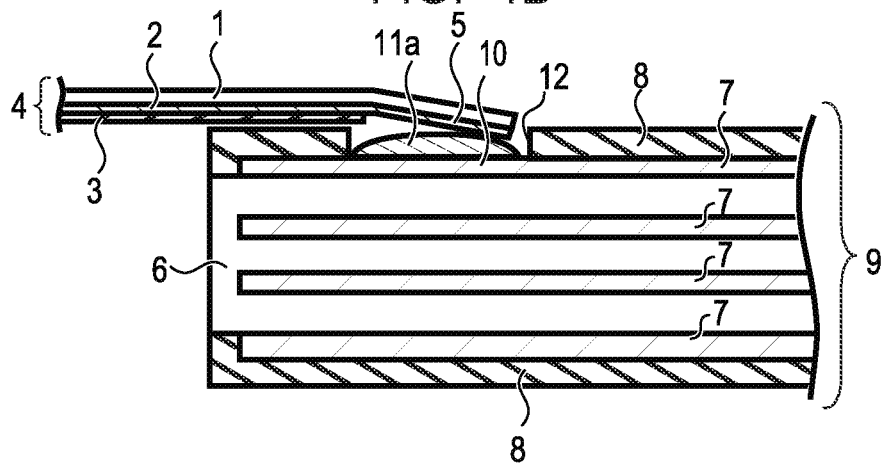
Figure 4C:
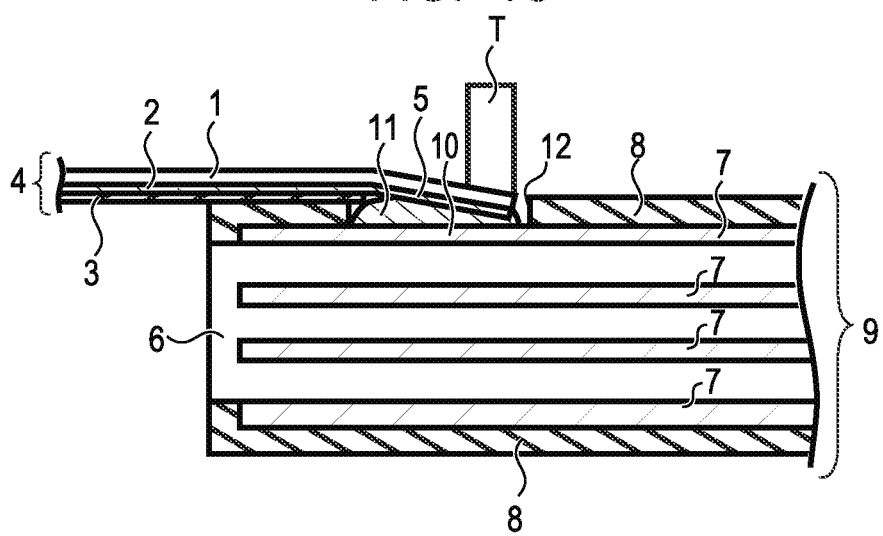

Next, another manufacturing method for manufacturing the electronic module 100 according to the first embodiment will be described with reference to FIG. 4A to FIG. 4C. FIG. 4A, FIG. 4B, and FIG. 4C are sectional views illustrating another manufacturing method of the electronic module 100 according to the first embodiment. Note that an electronic module 100 according to the second embodiment can also be manufactured by substantially the same method. Note that the manufacturing method for manufacturing the electronic module 100 includes a connection method for connecting the flexible wiring member 4 and the printed wiring board 9 to each other.

First, as illustrated in FIG. 4A, in the printed wiring board 9, a solder-contained connecting material 11a is supplied on the second electrode 10 exposed in the opening 12 formed in the second insulating layer 8. It is desirable that the volume V of the solder-contained connecting material satisfy Equation (1) as described in the first embodiment.

Next, as illustrated in FIG. 4B, the first electrode 5 of the flexible wiring member 4 and the second electrode 10 on the printed wiring board 9 are aligned so as to face each other, and the end part of the flexible wiring member 4 is arranged so as to fall in the opening 12 formed in the second insulating layer 8. Thus, the first electrode 5 and the second electrode 10 are contacted with the solder-contained connecting material 11a.

Further, it is desirable that the end of the flexible wiring member 4 and the inner wall of the opening 12 be arranged so as to be spaced apart from each other by a certain distance as described in the first embodiment.

Next, the end part of the flexible wiring member 4 was pressed with the tool T. Further, while being pressed by the tool T, the end part of the flexible wiring member 4 is caused to fall in the opening 12 formed in a solder resist, and the first electrode 5 and the second electrode 10 are then heated in contact with the solder-contained connecting material 11a. Accordingly, solder of the solder-contained connecting material 11a is melted. After completion of the heating, a junction part obtained by soldering is cooled by natural cooling, cooling with a cooler, or the like. Accordingly, as illustrated in FIG. 4C, the first electrode 5 and the second electrode 10 are connected via the solder 11. By doing so, it is possible to reliably connect the first electrode 5 and the second electrode 10 to each other and connect the first electrode 5 and the second electrode 10 to each other while preventing the solder 11 from extruding from a part between the first electrode 5 and the second electrode 10 and causing a short circuit failure.

Note that, while the tool T that is a jig for pressing the end part of the flexible wiring member 4 is not particularly limited, a heating tool such as a soldering copper may be used, for example. Further, when the heating for melting solder is local heating by a hot air, the tool T may be a nozzle that blows out hot air. Further, in a case of local heating using light of a lamp, a laser, or the like, a light guide plate that guides light may be used as the tool T. By using such a tool T, while enhancing the locality at the local heating, it is possible to connect the flexible wiring member 4 and the printed wiring board 9 to each other. Similarly, heating efficiency may be improved by using a dielectric material for the tool T when heating for melting solder is dielectric heating, and by using magnetic material for the tool T when heating for melting solder is induction heating.

Further, the end part of the tool T that presses the end part of the flexible wiring member 4 may have a slope so that the end side of the flexible wiring member 4 is lower than the side opposite to the end of the flexible wiring member 4. That is, the tool T may have an inclined slope so that the distance between the second electrode 10 and the flexible wiring member 4 becomes smaller toward the end side of the flexible wiring member 4 and the end part of the flexible wiring member 4 falls in the opening 12.

With the end part of the tool T having such a slope, when the tool T presses the end part of the flexible wiring member 4, the first electrode 5 and the second electrode 10 can be connected to each other while being reliably contacted with the solder-contained connecting material 11a on the end side of the flexible wiring member 4. On the other hand, on the side opposite to the end of the flexible wiring member 4, a space can be secured between the first electrode 5 and the second electrode 10, and it is possible to connect the first electrode 5 and the second electrode 10 to each other while preventing the solder 11 from extruding from a part between the first electrode 5 and the second electrode 10 and causing a short circuit failure.

Note that, while the case where the solder-contained connecting material 11a is supplied on the second electrode 10 has been described above, instead of or in addition to the above, the solder-contained connecting material 11a can also be supplied on the first electrode 5. Further, a manner to supply the solder-contained connection member 11a is not particularly limited and, for example, the solder-contained connecting material 11a can be supplied in a form of paste, or the solder-contained connecting material 11a can be supplied in a form of pre-coat.

Electronic Component

Third Embodiment

Figure 5:
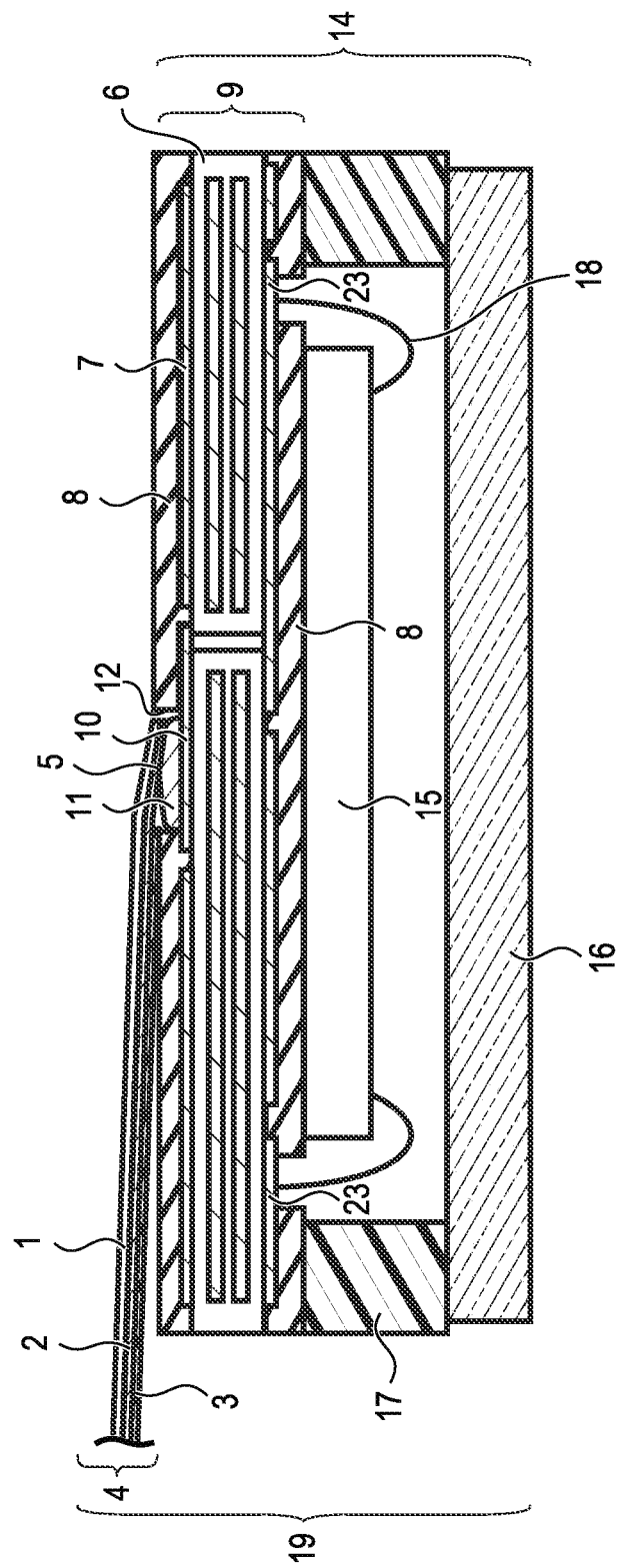
FIG. 5 is a sectional view illustrating an electronic component according to a third embodiment of the present invention.

An electronic component according to the third embodiment of the present invention will be described with reference to FIG. 5. FIG. 5 is a sectional view illustrating an electronic component according to the present embodiment.

In the present embodiment, as an electronic component, an imaging unit using the electronic module 100 having the flexible wiring member 4 and the printed wiring board 9 will be described. The flexible wiring member 4 and the printed wiring board 9 and the electronic module 100 having the flexible wiring member 4 and the printed wiring board 9 are the same as described in the above first and second embodiments.

As illustrated in FIG. 5, an imaging unit 19 according to the present embodiment has an imaging sensor module 14 and the flexible wiring member 4. The imaging sensor module 14 has the printed wiring board 9, an imaging sensor element 15 that is an imaging element, a frame member 17, and a cover glass 16.

The flexible wiring member 4 has the flexible base 1, the flexible wiring layer 2, and the coverlay 3. At the end part of the flexible wiring member 4, the coverlay 3 is not formed, and the flexible wiring layer 2 is exposed. The exposed part of the flexible wiring layer 2 forms the first electrode 5.

The printed wiring board 9 has the printed wiring base 6, the wiring layer 7, and the second insulating layer 8. The wiring layer 7 is exposed in the opening 12 formed in the second insulating layer 8. The exposed part of the wiring layer 7 forms the second electrode 10.

The flexible wiring member 4 is mounted on the face on which the second electrode 10 of the printed wiring board 9 is exposed in a state where a face on which the first electrode 5 is formed faces the printed wiring board 9. The first electrode 5 and the second electrode 10 are arranged to face each other so as to at least partially overlap in plan view from a direction perpendicular to the printed wiring board 9.

The end part of the flexible wiring member 4 is arranged so as to fall in the opening 12 formed in the second insulating layer 8. The first electrode 5 exposed in the end part and the second electrode 10 exposed in the opening 12 are connected via the solder 11.

Accordingly, the end part of the flexible wiring member 4 connected to the printed wiring board 9 by the solder 11 is bent and falls in the opening 12 formed in the second insulating layer 8 of the printed wiring board 9. On the other hand, the part opposite to the end of the flexible wiring member 4 is laid on the solder resist of the printed wiring board 9.

In the imaging sensor module 14, the imaging sensor element 15 is mounted on the opposite side to the face on which the flexible wiring member 4 of the printed wiring board 9 is connected. The frame member 17 is arranged and provided on the circumference of the face on which the imaging sensor element 15 of the printed wiring board 9 is mounted. The cover glass 16 is formed on the frame member 17 so as to face the imaging sensor element 15 without contacting with the imaging sensor element 15. The imaging sensor element 15 is arranged at the hollow part surrounded by the frame member 17 and the cover glass 16. The imaging sensor element 15 is electrically connected to a pad 23 used for wiring of the printed wiring board 9 via a metal wire 18.

Note that, while the case where the frame member 17 is provided has been described in the present embodiment, the arrangement position is not limited to the circumference of the printed wiring board 9. Further, the arrangement position of the imaging sensor element 15 may be in a hollow of the printed wiring board having a counterboring such as a cavity substrate, for example.

According to the present embodiment, the flexible wiring member 4 and the printed wiring board 9 can be connected each other in a smaller area than the case where the flexible wiring member 4 and the printed wiring board 9 are connected using a connector, and therefore reduction in size of the imaging sensor module 14 can be realized.

The imaging unit 19 including the imaging sensor module 14 can form an imaging apparatus such as a digital still camera or a digital video camera as an electronic equipment, for example. That is, the imaging apparatus as an electronic equipment can be configured to have a casing and the imaging unit 19 including the imaging sensor module 14 accommodated in the casing.

Imaging Unit

Fourth Embodiment

Figure 6A:
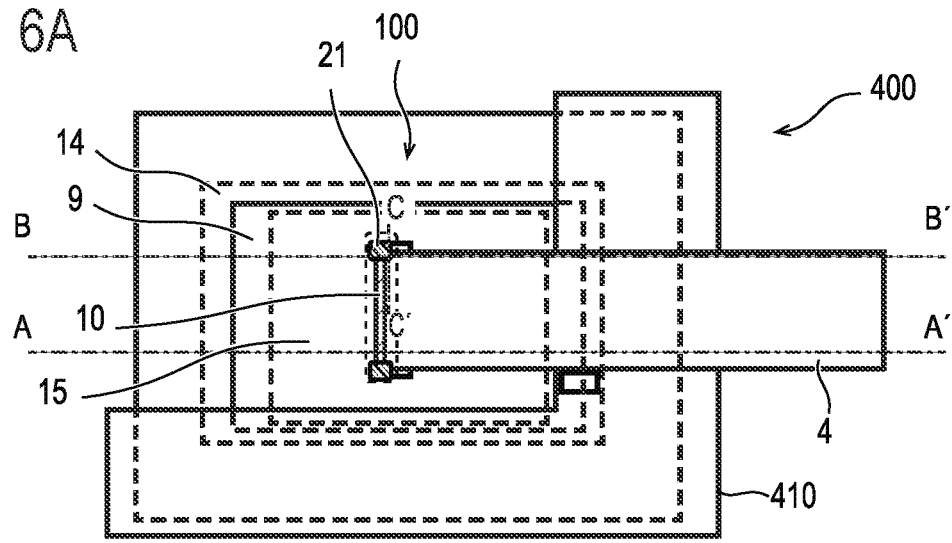
FIG. 6A, FIG. 6B, and FIG. 6C are schematic diagrams illustrating an imaging unit according to a fourth embodiment of the present invention.
Figure 6B:
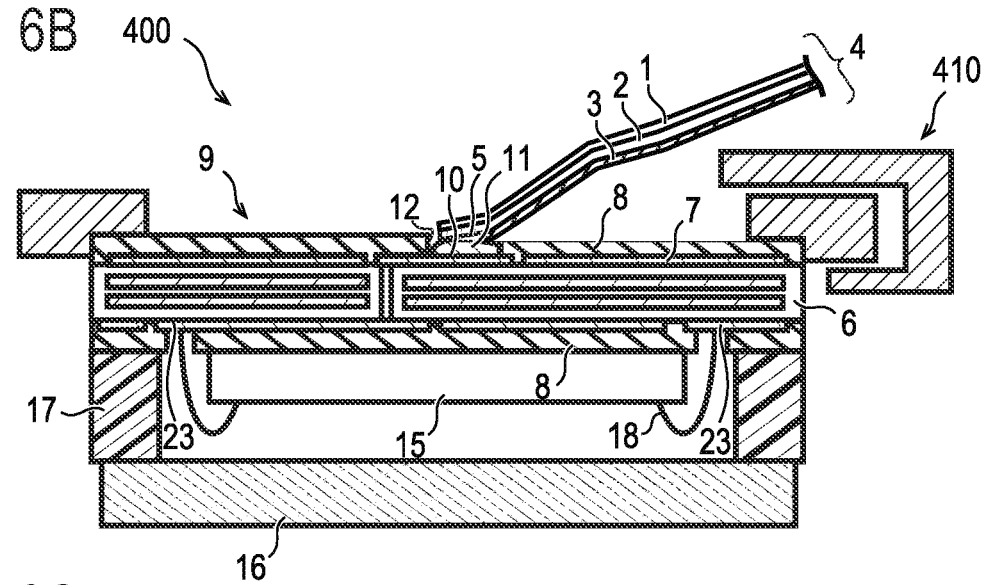
Figure 6C:
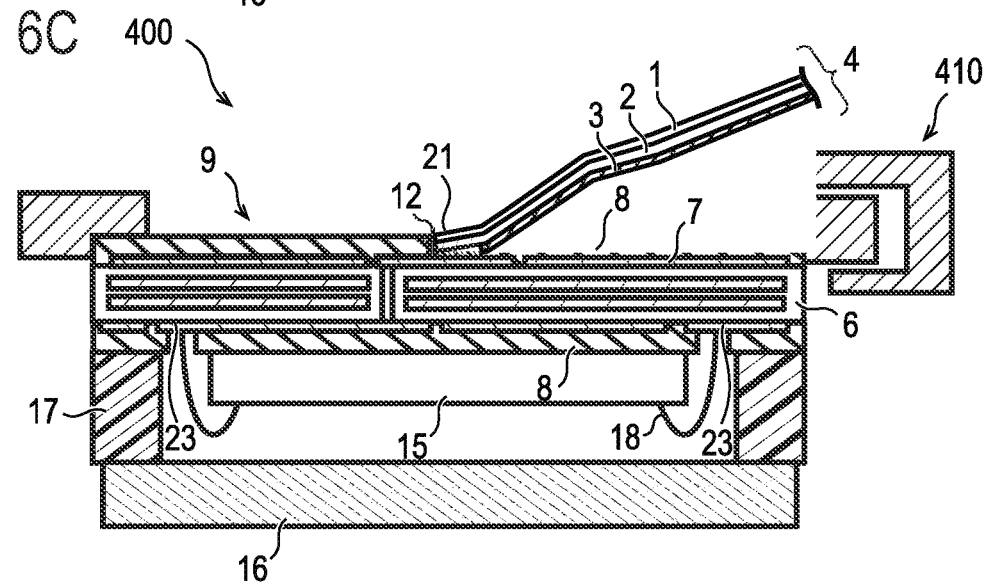

An imaging unit according to the fourth embodiment of the present embodiment will be described with reference to FIG. 6A to FIG. 8C. FIG. 6A is a top view illustrating an imaging unit 400 according to the present embodiment. FIG. 6B is a sectional view taken along a line A-A' of FIG. 6A. FIG. 6C is a sectional view taken along a line B-B' of FIG. 6A.

The imaging unit 400 is formed of the imaging sensor module 14, an image stabilizing unit 410, and the flexible wiring member 4. The imaging sensor module 14 has the imaging sensor element 15 mounted on the printed wiring board 9 and is formed of the frame member 17 and the cover glass 16 as with the third embodiment. The imaging sensor element 15 is electrically connected to a pad 23 used for wiring of the printed wiring board 9 via the metal wire 18 as with the third embodiment.

The printed wiring board 9 and the flexible wiring member 4 are connected via the solder 11 and form the electronic module 100 as with the third embodiment. Furthermore, in the present embodiment, a connection portion between the flexible wiring member 4 and the printed wiring board 9 is reinforced by a resin 21, as described below. Further, providing the resin 21 enables the structure in which peeling between the printed wiring board 9 and the flexible wiring member 4 is unlikely to occur.

Figure 7A:
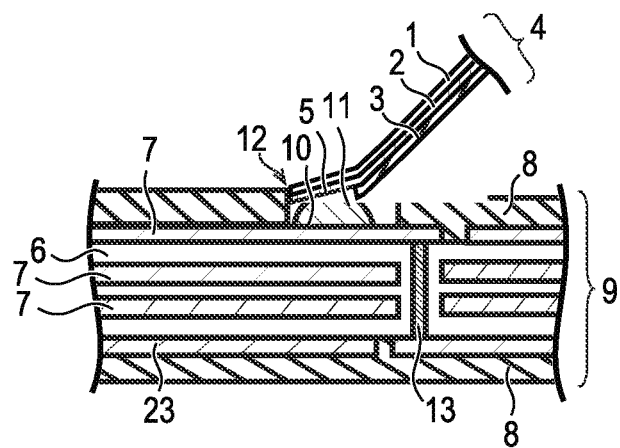
FIG. 7A, FIG. 7B, and FIG. 7C are sectional views illustrating the structure of connection portion between a flexible wiring member and a printed wiring board, which is a wiring base, in the imaging unit according to the fourth embodiment of the present invention.
Figure 7B:
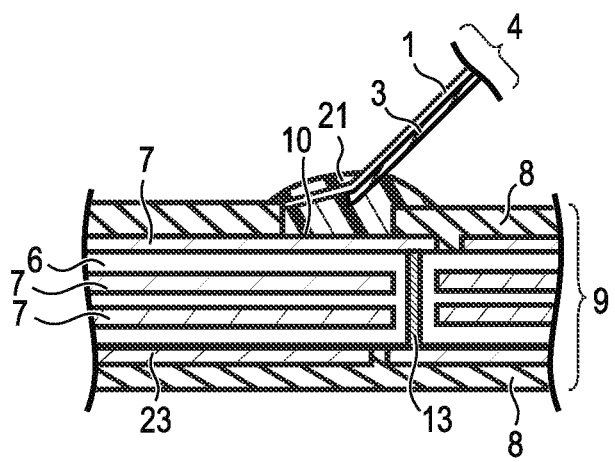
Figure 7C:
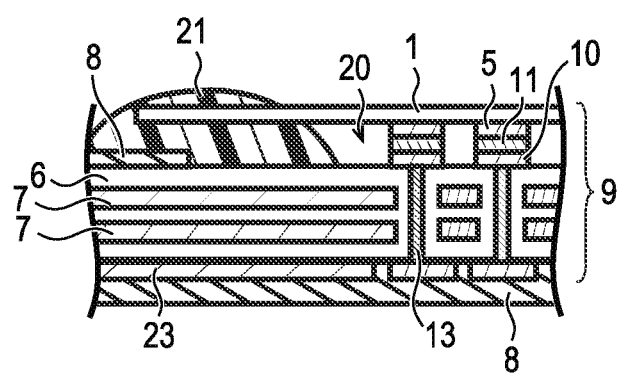

FIG. 7A, FIG. 7B, and FIG. 7C illustrate the structure of connection portion between the flexible wiring member 4 and the printed wiring board 9 in a sectional view taken along the line A-A', a sectional view taken along the line B-B', and a sectional view taken along a line C-C' of FIG. 6A, respectively.

The flexible wiring member 4 is formed of the flexible base 1 having flexibility, the flexible wiring layer 2, and the coverlay 3. At the end part of the flexible wiring member 4, the coverlay 3 is not formed, and the flexible wiring layer 2 is exposed. The exposed part of the flexible wiring layer 2 forms the first electrode 5.

The printed wiring board 9 is formed of the printed wiring base 6, the wiring layer 7, and the second insulating layer 8. The opening 12 is formed in the second insulating layer 8. The second electrode 10 is formed of the wiring layer 7 exposed in the opening 12.

As illustrated in FIG. 7A, the first electrode 5 and the second electrode 10 are connected to each other by the solder 11. The end part of the flexible wiring member 4 is arranged so as to be bent obliquely and fall in the opening 12 formed in the second insulating layer 8. The second electrode 10 of the printed wiring board 9 is connected to the pad 23 used for wiring by a via 13. A base of the printed wiring board 9 is a glass epoxy material, and the material of the wiring layer 7 is formed of a metal.

As illustrated in FIG. 7B, a connection portion between the flexible wiring member 4 and the printed wiring board 9 is reinforced by the resin 21 so as to cover the coverlay 3 at both edge parts in the pitch direction of wirings, that is, in the pitch direction of the first electrode 5 and the second electrode 10.

As illustrated in FIG. 7C, at both edge parts reinforced by the resin 21, the resin 21 and the solder 11 are formed via a space 20 so as to be spaced apart from each other.

In such a way, the end part of the flexible wiring member 4 has the resin 21 covering the edge parts in the width direction at the end parts. The resin 21 and the solder 11 are arranged between the flexible base 1 and the printed wiring board 9 so as to be spaced apart from each other.

Since the space 20 is present between the resin 21 and the solder 11, the force applied to the solder 11 when tensile force occurs in the flexible wiring member 4 is reduced compared to the case where the space 20 is absent between the resin 21 and the solder 11 because the flexible base 1 has flexibility. Therefore, connection reliability is improved.

On the other hand, when the resin 21 is in contact with the solder 11, and there is no space between the resin 21 and the solder 11, force to pull the flexible wiring member 4 is directly applied to the solder 11. It is thus desirable that the material of the resin 21 have lower Young's modulus than the material of the solder 11.

Figure 8A:
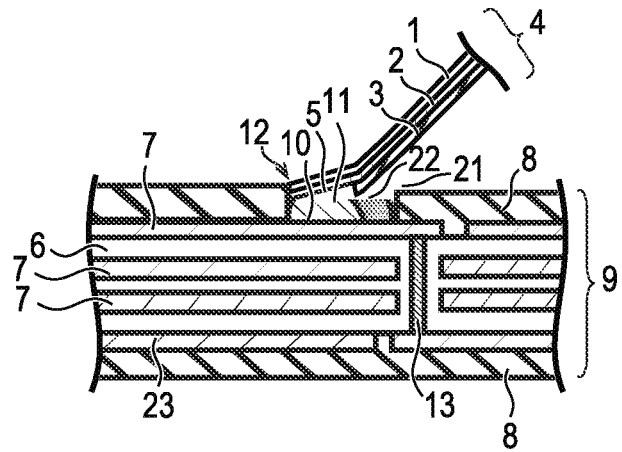
FIG. 8A, FIG. 8B, and FIG. 8C are sectional views illustrating another structure of a connection portion between a flexible wiring member and a printed wiring board, which is a wiring base, in the imaging unit according to the fourth embodiment of the present invention.
Figure 8B:
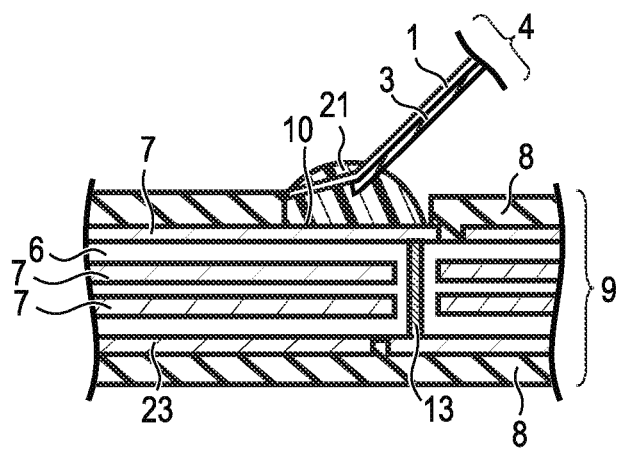
Figure 8C:
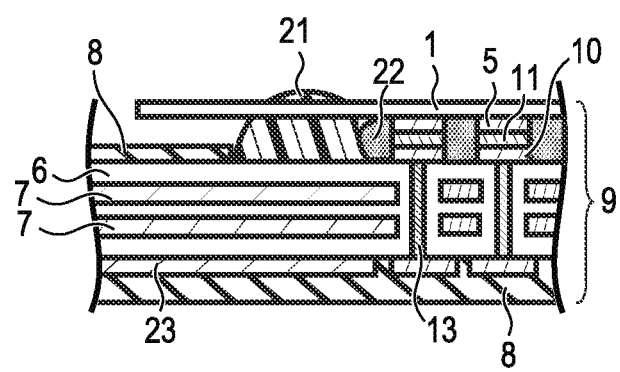

Moreover, even when a space between the resin 21 and the solder 11 is not provided, an intermediate member 22 may be provided between the resin 21 and the solder 11 as illustrated in FIG. 8A to FIG. 8C. FIG. 8A, FIG. 8B, and FIG. 8C illustrate another structure of connection portion between the flexible wiring member 4 and the printed wiring board 9 in a sectional view taken along the line A-A', a sectional view taken along the line B-B', and a sectional view taken along the line C-C' of FIG. 6A, respectively.

The intermediate member 22 is formed of a material having lower Young's modulus than the resin 21 and the solder 11. For example, the intermediate member 22 may be an elastic member such as a resin having low Young's modulus or flux included in a solder paste used for connecting the solder 11.

In such a way, the electronic module 100 may have the intermediate member 22 having a lower Young's modulus than the resin 21 and the solder 11. In such a case, the resin 21 and the intermediate member 22 are arranged to contact with each other and the intermediate member 22 and the solder 11 are arranged to contact with each other between the flexible base 1 and the printed wiring board 9.

With the intermediate member 22 being provided, the force applied to the solder 11 when tensile force occurs in the flexible wiring member 4 is reduced to be smaller than in the case where the resin 21 and the solder 11 are in contact with each other. Therefore, connection reliability is improved.

While not particularly limited, the resin 21 is an epoxy resin, for example. Note that, since the resin 21 is provided after connecting the solder 11, flux may be re-melted by heating for curing the resin 21. When flux is re-melted, flux further attaches onto the flexible wiring member 4 or the printed wiring board 9 on the resin 21 side and inhibits adhesion between the resin 21 and flexible wiring member 4 or the printed wiring board 9. Thus, it is desirable that the resin 21 be a resin that can be cured at a room temperature or an ultraviolet-curable resin.

Electronic Equipment

Fifth Embodiment

Figure 9:
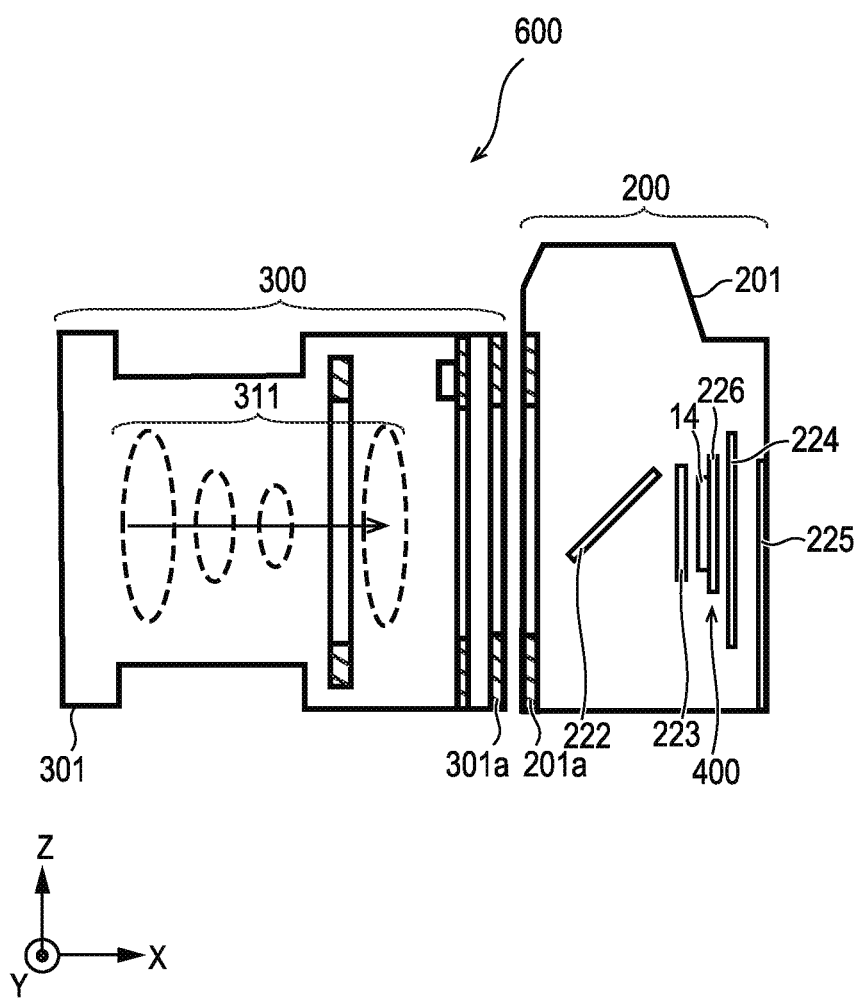
FIG. 9 is a diagram illustrating a general configuration of an imaging apparatus as an example of an electronic equipment according to a fifth embodiment of the present invention.

An electronic equipment according to a fifth embodiment of the present invention will be described with reference to FIG. 9. FIG. 9 is a diagram illustrating a general configuration of an imaging apparatus as an example of the electronic equipment according to the present embodiment.

A digital camera (camera) 600 as an imaging apparatus that is an example of electronic equipments is a digital single-lens reflex camera, for example, and has a camera main body 200 and a replaceable lens (lens barrel) 300 that is removable from the camera main body 200. In FIG. 9, the replaceable lens 300 is mounted on the camera main body 200. A case where the replaceable lens 300 is mounted on the camera main body 200 and thereby the imaging apparatus is formed will be described below.

The camera main body 200 has a casing 201 and has a mirror 222, a shutter 223, an imaging unit 400 that is an electronic module, and an image processing circuit 224, which are arranged inside the casing 201. Further, the camera main body 200 has a liquid crystal display 225 fixed to the casing 201 so as to be exposed out of the casing 201. The imaging unit 400 has an image stabilizing unit 410, the imaging sensor module 14 having the printed wiring board 9, and an electronic module 226.

The replaceable lens 300 has a casing 301, which is a replaceable lens housing, and an imaging optical system 311 that is arranged inside the casing 301 and, when the casing 301 (the replaceable lens 300) is mounted on the casing 201, captures an optical image on the imaging sensor module 14. The imaging optical system 311 has a plurality of lenses.

The casing 301 has a lens-side mount 301a in which an opening is formed, and the casing 201 has a camera-side mount 201a in which an opening is formed. The lens-side mount 301a and the camera-side mount 201a are fit to each other, and thereby the replaceable lens 300 (the casing 301) is mounted on the camera main body 200 (the casing 201). The arrow X direction illustrated in FIG. 9 is the optical axis direction of the imaging optical system 311.

A light propagating in the arrow X direction through the imaging optical system 311 is guided into the casing 201 through the opening of the lens-side mount 301a in the casing 301 and the opening of the camera-side mount 201a in the casing 201. The mirror 222, the shutter 223, and the like are provided in the arrow X direction in front of the imaging unit 400 along the arrow X direction inside the casing 201.

The imaging sensor module 14 accommodated in the casing 201 has the imaging sensor element 15 mounted on the printed wiring board 9 and is formed of the frame member 17 and the cover glass 16. The flexible wiring member 4 is connected to the printed wiring board 9. The imaging sensor element 15 is a solid state imaging element such as a CMOS image sensor, a CCD image sensor, or the like that photoelectrically converts a captured optical image.

Further, the cover glass 16 is formed in the frame member 17 so as to face the imaging sensor element 15 without contacting with the imaging sensor element 15. The imaging sensor element 15 is arranged in a hollow part surrounded by the frame member 17 and the cover glass 16.

The image sensor element 15 is electrically connected to the printed wiring board 9 by the pad 23 used for wiring through the metal wire 18.

Display Apparatus

Sixth Embodiment

Figure 10A:
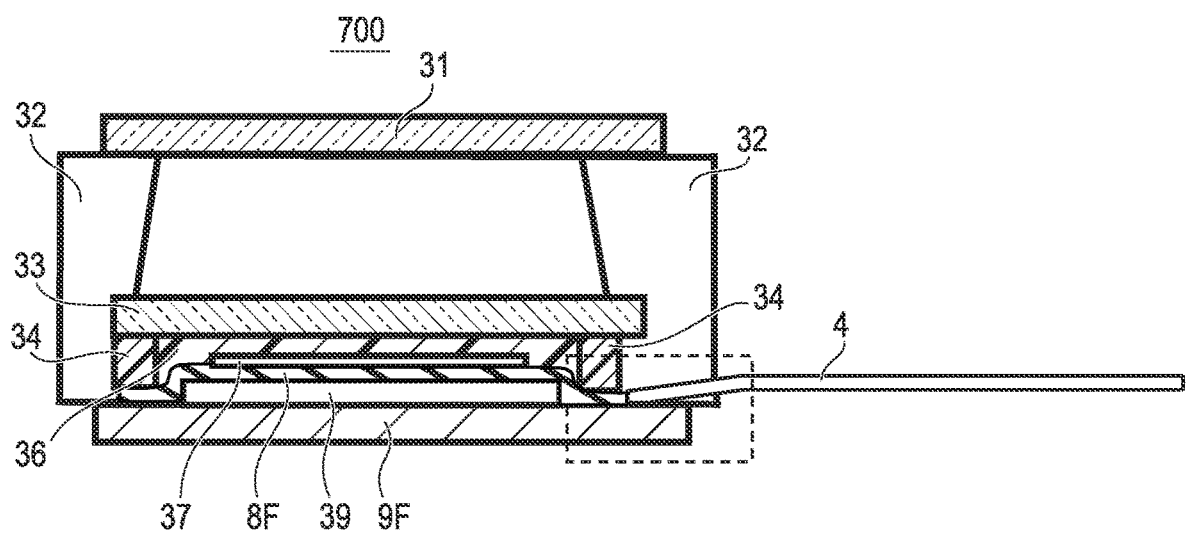
FIG. 10A and FIG. 10B are diagrams illustrating a general configuration of a display apparatus as an example of an electronic equipment according to a sixth embodiment of the present invention.
Figure 10B:
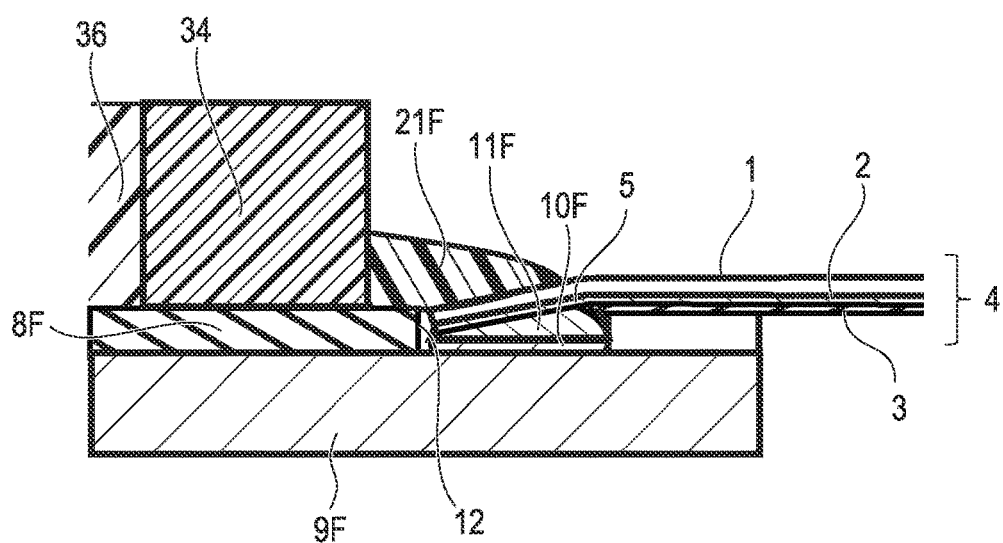

The electronic equipment according to a sixth embodiment of the present invention will be described with reference to FIG. 10A and FIG. 10B. FIG. 10A and FIG. 10B are diagrams illustrating a general configuration of a display apparatus as an example of the electronic equipment according to the present embodiment.

A display apparatus 700 that is an example of electronic equipments is a display, for example, and may be used for a monitor portion of an imaging apparatus. As illustrated in FIG. 10A, a silicon substrate 9F that is a wiring circuit board is provided, and a light emitting element 39, a second insulating layer 8F, a color filter 37, a resin 36, and a cover glass 33 are stacked in this order on the silicon substrate 9F. A package part 32 forms the outer circumference of the display apparatus and surrounds the light emitting element 39, the second insulating layer 8F, the color filter 37, the resin 36, and the cover glass 33. Further, a dust-proof glass 31 is provided on the package part 32 via an adhesive agent (not illustrated).

The light emitting element 39 is an organic light emitting element and has an anode and a cathode that are a pair of electrodes and an organic compound layer arranged between these electrodes. The organic compound layer is a stacked member formed of one or a plurality of layers having at least a light emitting layer. When the organic compound layer is a stacked member formed of a plurality of layers, this organic compound layer may have any of a hole injection layer, a hole transport layer, an electron blocking layer, a hole block layer (a hole inhibition layer, a hole/exciton blocking layer), an electron transport layer, and an electron injection layer, for example, other than a light emitting layer.

The second insulating layer 8F is a protection layer used for suppressing time degradation of the light emitting element 39 and may be a metal nitride or a metal oxide having a high insulation, such as SiN or $Al_2O_3$, for example.

For a color filter 37, filters that transmit three colors of red, green, and blue, for example, may be used.

The resin 36 is used for the purpose of sealing and provided so as to fill the space between the cover glass 33, the color filter 37, a seal member 34, and the second insulating layer 8F.

FIG. 10B is an enlarged view of a portion surrounded by the dashed line of FIG. 10A. The flexible wiring member 4 is formed of the flexible base 1 having flexibility, the flexible wiring layer 2, and the coverlay 3. The coverlay 3 is not formed at the end part of the flexible wiring member 4, and the flexible wiring layer 2 is exposed. The exposed portion of the flexible wiring layer 2 forms the first electrode 5.

The second insulating layer 8F is provided on the silicon substrate 9F, and the opening 12 is formed in the second insulating layer 8F. The second electrode 10F that is a Cu pad is formed in the opening 12. As illustrated in FIG. 10B, the first electrode 5 and the second electrode 10F are connected by an anisotropic conductive film (ACF) 11F that is a conductive connection member. The end part of the flexible wiring member 4 is arranged so as to obliquely bend and fall in the opening 12 formed in the second insulating layer 8F. With the flexible wiring member 4 having such a shape, the contact area between the flexible wiring member 4 and the silicon substrate 9F can be reduced as with the first to fifth embodiments.

Further, as illustrated in FIG. 10B, a resin 21F for reinforcement is provided on the flexible base 1 is provided in the connection portion between the flexible wiring member 4 and the anisotropic conductive film (ACF) 11F. With the resin 21F being provided, the stress applied to the anisotropic conductive film 11F, which is a conductive connection member, is reduced when tensile force occurs in the flexible wiring member 4, and connection reliability is improved.

Modified Embodiments

Various modifications can be made to the present invention without being limited to the embodiments described above. For example, while the imaging sensor module 14 has been described as a device having the printed wiring board 9 in the above third embodiment as an example, the example is not limited thereto. The device may be any type of devices, and other than the imaging sensor module 14, devices having various printed wiring boards 9 such as a printed wiring board 9 on which an LSI is mounted can be connected.

Further, the electronic module according to the embodiments described above may be accommodated in a casing to form various electronic equipments other than the imaging apparatus.

According to the present invention, a flexible wiring member and a wiring circuit board can be directly connected by a small area.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2019-009363, filed Jan. 23, 2019, and Japanese Patent Application No. 2019-227601, filed Dec. 17, 2019, which are hereby incorporated by reference herein in their entirety.

What is claimed is:

1. An electronic module comprising:
a flexible wiring member;
a wiring circuit board; and
a conductive connection member,
wherein the flexible wiring member comprises:
  a first base which is an insulating and flexible base;
  a first wiring layer formed on the first base; and
  a first insulating layer formed on the first base so that a part of the first wiring layer is arranged between the first base and the first insulating layer,
wherein the wiring circuit board comprises:
  a second base;
  a second wiring layer formed on the second base; and
  a second insulating layer formed on the second base so that a part of the second wiring layer is arranged between the second base and the second insulating layer,
wherein the flexible wiring member includes a plurality of first electrodes formed of the first wiring layer, the wiring circuit board includes a plurality of second electrodes formed of the second wiring layer,
wherein the first base includes a first part and a second part that is more distant from an end of the flexible wiring member than the first part,
wherein the plurality of first electrodes and the plurality of second electrodes are connected to each other via the conductive connection member between the second base and the both of the first part and the second part in a direction perpendicular to the wiring circuit board,
wherein a first distance between the first part and the plurality of second electrodes is less than a second distance between the second part and the plurality of second electrodes,
wherein a first thickness of the conductive connection member between the first part and the plurality of second electrodes is less than a second thickness of the conductive connection member between the second part and the plurality of second electrodes, and wherein the first distance is less than a thickness of the second insulating layer and the second thickness.

2. The electronic module according to claim 1, wherein the flexible wiring member has a portion contacting with the second insulating layer.

3. The electronic module according to claim 1, wherein the electronic module further comprises a resin covering an edge part of the flexible wiring member, and wherein the resin and the conductive connection member are arranged so as to be spaced apart from each other between the flexible wiring member and the wiring circuit board.

4. The electronic module according to claim 1, wherein the electronic module further comprises a resin covering an edge part of the flexible wiring member, wherein the electronic module further comprises an intermediate member having lower Young's modules than the resin and the conductive connection member, and wherein, between the first base and the wiring circuit board, the resin and the intermediate member are arranged to be contacted with each other, and the intermediate member and the conductive connection member are arranged to be contacted with each other.

5. The electronic module according to claim 1, wherein the thickness of the second insulating layer is 20 to 40 μm.

6. The electronic module according to claim 5, wherein the conductive connection member is an anisotropic conductive film or an anisotropic conductive resin.

7. The electronic module according to claim 1, wherein the second insulating layer is formed of a solder-resist.

8. The electronic module according to claim 1, wherein, the conductive connection member comprises plural pieces of solder.

9. The electronic module according to claim 1, wherein a distance between two first electrodes of the plurality of first electrodes neighboring each other is greater than the thickness of the second insulating layer.

10. The electronic module according to claim 9, wherein a width of each of the two first electrodes in a direction where the two first electrodes are neighboring is greater than the distance between the two of the plurality of first electrodes.

11. The electronic module according to claim 1, wherein the second thickness is less than the thickness of the second insulating layer.

12. The electronic module according to claim 1, wherein the conductive connection member is in contact with the second insulating layer.

13. The electronic module according to claim 1, wherein the second base includes a silicon substrate.

14. An electronic equipment comprising:
a casing; and
the electronic module according to claim 1 accommodated in the casing.

15. The electronic equipment according to claim 14 further comprising:
an imaging sensor mounted on the wiring circuit board, wherein the wiring circuit board is arranged between the imaging sensor and the flexible wiring member.

16. The electronic equipment according to claim 14 further comprising:
an image processing circuit accommodated in the casing, wherein the flexible wiring member connects the wiring circuit board and the image processing circuit.

17. The electronic equipment according to claim 14, further comprising:
a unit accommodated in the casing,
wherein the unit is configured to move the wiring circuit board.

18. The electronic equipment according to claim 14, wherein the flexible wiring member extends to form a space between the flexible wiring member and the wiring circuit board, a distance between the flexible wiring member and wiring circuit board through the space exceeds the thickness of the second insulating layer.

19. The electronic equipment according to claim 14, wherein the flexible wiring member has a part that does not overlap the face of the wiring circuit board in a direction perpendicular to the face of the wiring circuit board.

20. An electronic equipment comprising:
the electronic module according to claim 1; and
an imaging element mounted on the wiring circuit board, wherein the imaging element is electrically connected to the wiring circuit board via a metal wire.

21. An electronic equipment comprising:
the electronic module according to claim 1;
an imaging element mounted on the wiring circuit board; and
an image stabilizing unit to move the imaging element.

22. A display apparatus comprising:
the electronic module according to claim 1; and
a light emitting element on the wiring circuit board.

23. The electronic module according to claim 1,
wherein the second insulating layer does not extend between the plurality of the first electrodes.

24. The electronic module according to claim 1,
wherein the second insulating layer includes a first portion and a second portion,
wherein an opening is formed between the first portion and the second portion in a first direction, and
the plurality of second electrodes are arranged between the first portion and the second portion in the first direction.

25. The electronic module according to claim 24, wherein a width of an end part of the flexible wiring member is smaller than a width of the opening in the first direction.

26. The electronic module according to claim 24,
wherein the second insulating layer includes a third portion,
wherein the third portion of the second insulating layer is provided between the second base and the flexible wiring member.

27. The electronic module according to claim 26,
wherein at least a part of the first insulating layer is located between the first wiring layer and the third portion of the second insulating layer in the direction perpendicular to the wiring circuit board.

28. The electronic module according to claim 27, wherein the part of the first insulating layer is arranged with an inclination relative to the third portion of the second insulating layer.

29. The electronic module according to claim 26, wherein a part of the first base overlapping the third portion of the second insulating layer is arranged with an inclination relative to the third portion of the second insulating layer.

30. The electronic module according to claim 26, wherein a part of the second wiring layer is arranged between the second base and the third portion of the second insulating layer.

31. The electronic module according to claim 26, wherein the second insulating layer includes a fourth portion,
- wherein the opening is formed between the third portion and the fourth portion in a second direction perpendicular to the first direction, and
- wherein a first side of the opening formed by one of the third portion and the fourth portion is longer than a second side of the opening formed by one of the first portion and the second portion.

32. The electronic module according to claim 31, wherein the conductive connection member is surrounded by the second insulating layer, and the conductive connection member does not extend between the fourth portion of the second insulating layer and the flexible wiring member in the direction perpendicular to the wiring circuit board.

33. The electronic module according to claim 31, wherein the end of the flexible wiring member is opposite to the fourth portion of the second insulating layer in the plan view.

34. The electronic module according to claim 33, wherein an end of the flexible wiring member is arranged so as to be spaced apart from the fourth portion of the second insulating layer.

* * * * *